Oct. 12, 1965 W. A. KRALL ET AL 3,211,822

HEAT DISSIPATING AND SHIELDING STRUCTURE FOR MOUNTING ELECTRONIC COMPONENT UPON A SUPPORT

Filed Nov. 15, 1962 2 Sheets-Sheet 1

INVENTORS
WILLIAM A. KRALL
JAMES A. MANN
LEWIS W. COTT

BY Michael A. Sileo, Jr.
AGENT

Oct. 12, 1965 W. A. KRALL ET AL 3,211,822

HEAT DISSIPATING AND SHIELDING STRUCTURE FOR MOUNTING ELECTRONIC COMPONENT UPON A SUPPORT

Filed Nov. 15, 1962 2 Sheets-Sheet 2

INVENTORS
WILLIAM A. KRALL
JAMES A. MANN
LEWIS W. COTT

BY Michael A. Sileo, Jr.
AGENT 3,211,822

HEAT DISSIPATING AND SHIELDING STRUCTURE FOR MOUNTING ELECTRONIC COMPONENT UPON A SUPPORT

William A. Krall, Seminole County, and James A. Mann and Lewis W. Cott, Orange County, Fla., assignors to Martin-Marietta Corporation, Middle River, Md., a corporation of Maryland Filed Nov. 15, 1962, Ser. No. 237,961
10 Claims. (Cl. 174—35)

The invention relates to mounting structures for electronic apparatus having improved mechanical, thermal and electrical characteristics, and more particularly to a structure for securing small electron discharge tubes, commercially known as "miniature" and "subminiature" tubes, to mounting boards, printed circuit boards and chassises, which structure further provides improved heat dissipation and effective shielding from high frequency energy, noise and extraneous radiation.

In the years following the end of World War II, an increased interest and subsequent demand for miniaturization of electronic circuits ensued due to the considerable advances in electronic technology, the complexity of electronic circuitry and the new size and weight requirements for aerospace electronic apparatus. The advent of the art of miniaturization, however, brought with it many problems. First, special means were required for mounting the components within the electronic apparatus since it was necessary to distribute a very large number of electronic components within an exceptionally small space. Second, since certain components of the electronic apparatus, such as, electron tubes and power resistors, generate high temperatures, special means were needed for thermally dissipating this heat. Third, because of the very close proximity of the components of the miniaturized electronic apparatus, effective shielding of the components from high frequency energy, noise and extraneous radiation became significantly important.

One of the first methods used to reduce or miniaturize the size of electron discharge tubes was the elimination of the old Bakelite tube base with its heavy pins. These early miniaturized electronic tubes had in effect no base but instead the glass envelope was merely crimped down around small wire leads. This new electronic tube structure created the need for effective tube clamping structures and motivated many arrangements for clamping the tubes to mounting boards, printed circuit boards and chassises. These prior known arrangements, however, contained several inherent disadvantages some of which are scratching, marring or undesirably stressing the tube envelope, difficulty in installing or removing the tubes, insufficient shock absorption, high cost to manufacture, and excessive space requirements.

Accordingly, one object of the present invention is to provide a novel mounting structure which effectively eliminates the foregoing deficiencies of prior known clamping structures.

As a result of the compactness of electron tubes, heat dissipation from the tubes became a critical problem. This is so since the life of vacuum tubes is considerably reduced when it is operating at elevated envelope temperatures. In addition, since electronic components such as resistors, inductors, capacitors, etc. have a predictable life relative to operating temperatures, heat dissipated from miniaturized electron tubes adversely affect the life of adjacent components. Accordingly, many attempts were tried to effectively remove the heat generated by the miniaturized electron tubes but such attempts were not completely satisfactory. In most cases, highly complicated and bulky structures were used thereby necessitating involved and costly manufacturing techniques and requiring tedious tube installation and removal procedures.

Various forced air cooling systems and bulky heat shields were tried but none of these prior known methods for dissipating heat were completely successful.

Several inherent disadvantages existed in these prior known thermal dissipating devices, e.g., excessive space requirements, costly manufacturing procedures, insufficient heat conductive paths to reduce envelope temperatures to the point needed for optimum component reliability, and excessive component requirements.

Accordingly, it is another object of the present invention to provide a novel mounting structure which effectively eliminates the foregoing disadvantages of prior known thermal dissipating structures.

Because of the very close proximity of the components of a miniaturized electronic apparatus, effective shielding of the components, particularly miniaturized electron tubes, from high frequency energy, noise or extraneous radiation became a significant problem. The prior art is replete with shielding structures but none of these devices have completely solved the shielding problem. Though the prior known shielding structures were satisfactory in many respects they contained several inherent disadvantages some of which are insufficient prevention of inductive or capacitive coupling from sources external to that of the electron tube being shielded, inadequate grounding of the shielding structure, inadequate prevention of radiation from the component being shielded to the adjacent components of the miniaturized electronic apparatus, and excessive space requirements.

Accordingly, it is another object of the present invention to provide a novel mounting structure which effectively eliminates the foregoing disadvantages of prior known shielding structures.

In accordance with the present invention, a mounting structure is formed from a substantially flat sheet or strip of material having high thermal and electrical conductivity characteristics and comprises a coiled portion for resiliently gripping the envelope of an electronic component. Another portion of the sheet of material is bent 180° so as to form an inwardly projecting U-shaped flange portion for frictionally gripping the peripheral surfaces of a mounting board and for holding the electronic component in close proximity to the surface of a mounting board. The U-shaped flange portion of the mounting structure, as well as other circuit components, are flow soldered in place to the metal coated surface of the mounting board so as to provide an improved and efficient heat conduction path from the envelope of the electronic component to the metal coated surface (heat sink) of the mounting board.

This mounting structure serves the quadruplicate function of providing an effective and improved (1) mounting of the electronic component to the mounting board, (2) thermal dissipation, (3) electrostatic and electro-magnetic shielding of the electronic component, and (4) electrical grounding of the structure.

It is therefore a primary object of the present invention to provide a combined mounting, thermal dissipating and shielding structure having effective electrical grounding characteristics.

It is another object of the present invention to provide a structure for securing electron discharge devices to mounting boards, printed circuit boards and chassises which structure also provides improved thermal dissipation and effective shielding from high frequency energy, noise and extraneous radiation.

It is another object of the present invention to provide a new and improved mounting, thermal dissipating and shielding structure which is effectively adapted to secure, cool and shield miniature and subminiature electron tubes.

It is another object of the present invention to provide novel mounting, thermal dissipating and shielding structures for electron discharge devices which (1) are formed from a substantially flat piece of highly thermal and electrically conductive material, (2) do not require bulky and unreliable connecting means, (3) are automatically adjustable to variable size electron discharge devices, (4) are automatically adjustable to thermal expansion or compression of the electron discharge device, (5) are quickly connected to a mounting board, printed circuit board or chassis without the aid of nuts, bolts, screws or the like, and (6) permit quick and simple insertion and removal of the electron discharge device without scratching, marring or undesireably stressing of the envelope of the electron discharge device.

It is another object of the present invention to provide a combined mounting, thermal dissipating and shielding structure for electron discharge devices wherein the device may be mounted with its axis either in a direction parallel or in a direction perpendicular to the mounting board, printed circuit board or chassis surface.

It is another object of the present invention to provide a combined mounting, thermal dissipating and shielding structure for electron discharge devices which uniquely provides improved mechanical, thermal and electrical characteristics.

It is another object of the present invention to provide a new and improved mounting, thermal dissipating and shielding structure for electron discharge devices which is simple in construction, economical to manufacture and highly reliable in performing the functions intended and achieving the desired objects.

Other objects and many attendant advantages of this invention will be readily appreciated as the same becomes better understood by reference to the following detailed description when considered in connection with the accompanying drawings wherein.

Figures 1, 4, 7:
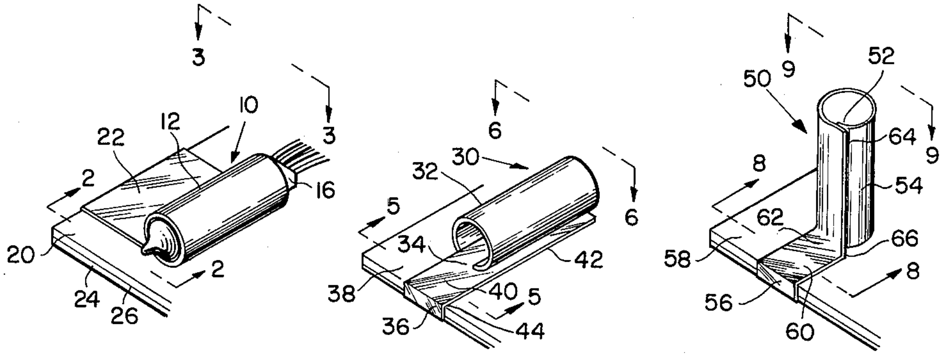
FIGURE 1 is an isometric view of a first embodiment of the present invention showing the physical arrangement of the electron discharge tube, mounting and mounting board.
FIGURE 4 is an isometric view of a second embodiment of the present invention also showing the physical arrangement of the elements.
FIGURE 7 is an isometric view of a third embodiment of the present invention also showing the physical arrangement of elements.
Figure 2:
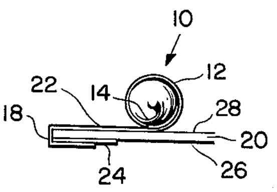
FIGURE 2 is an end view of the first embodiment taken along the plane 2—2 of FIGURE 1.
Figure 3:
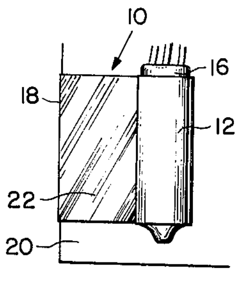
FIGURE 3 is a top view of the first embodiment taken along the plane 3—3 of FIGURE 1.

Referring now in detail to FIGURES 1–3 of the drawings, there is shown an isometric, end and top view, respectively, of a first embodiment of the present invention. The mounting structure, generally indicated at 10, is formed from a rectangular sheet of substantially resilient material having high thermal and electrical conductivity characteristics and comprises a coiled portion 12 having a slight overlap 14 for resiliently gripping the envelope of an electronic component, such as, the electron tube 16, a 180° inwardly projecting U-shaped flange portion 18 for frictionally gripping the peripheral surfaces of a mounting board 20, and a central portion 22 connecting flange portion 18 with coil portion 12. The board 20 is a conventional mounting board having a coating of metal 24, such as copper, on its lower surface 26 and an uncoated upper surface 28. The sheet of resilient material is preferably tin plated brass, though tin plated steel, aluminum, sheet cooper or coated steel may be used as well. In this embodiment, the tube 16 is held by the mounting structure in a position in which its axis is parallel to both the mounting board 20 and the edge of flange 18.

In practical operation of the embodiment of FIGURES 1–3, the tube 16 is slidably inserted into the coil portion 12 wherein it is resiliently held in position as shown. The flange portion 18 is slidably positioned onto the mounting board 20 whereby it frictionally engages the peripheral surfaces of mounting board 20 and holds the mounting sructure in position. The mounting structure may then be flow soldered in position to the mounting board by any well known flow soldering procedure for providing a substantially permanent and positive connection between the mounting structure and mounting board. Finally, the complete mounting board, including any other electronic apparatus connected thereto, may then be encased with a conventional potting compound or encapsulating agent by any well known or encapsulating procedure, respectively.

Figure 5:
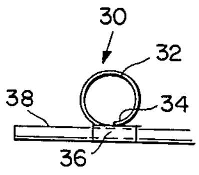
FIGURE 5 is an end view of the second embodiment taken along the plane 5—5 of FIGURE 4.
Figure 6:
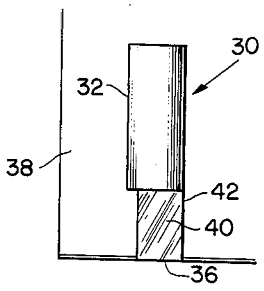
FIGURE 6 is a top view of the second embodiment taken along the plane 6—6 of FIGURE 4.

Referring now in detail to FIGURES 4–6, there is shown an isometric, end and top view, respectively, of a second embodiment of the present invention. The mounting structure, generally indicated at 30, is constructed from a substantially L-shaped sheet of material having high thermal and electrical conductivity characteristics. One leg of the L-shaped sheet is rolled about an axis with a slight overlap 34 to form a coiled or loop portion 32 for resiliently gripping an electronic component, such as, the envelope of an electron tube, and the other leg of the L-shaped sheet is bent 180° about an axis to form an inwardly projecting U-shaped flange portion 36 for frictionally gripping the peripheral surfaces of the mounting board 38. A connecting portion 40 is provided for connecting the coil portion 32 and the flange portion 36. In this embodiment, the electronic component (not shown) will be held by the mounting structure in a position in which its axis will be parallel to the mounting board 38 and perpendicular to the edge of flange 36. It should be noted, that the edge 42 of coiled portion 32 is twisted upward and away from board 38 about a point 44 for establishing a more absolute gripping of the electronic component inserted within the coiled portion 32. The practical operation of the embodiment of FIGURES 4–6 is substantially the same as that described in detail with regard to FIGURES 1–3.

Figure 8:
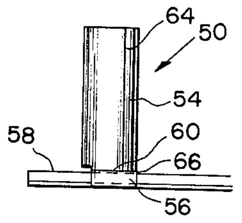
FIGURE 8 is an end view of the third embodiment taken along the plane 8—8 of FIGURE 7.
Figure 9:
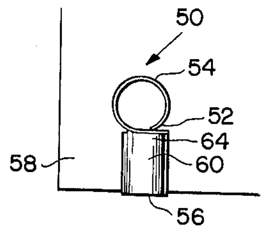
FIGURE 9 is a top view of the third embodiment taken along the plane 9—9 of FIGURE 7.

Referring now in detail to FIGURES 7–9, there is shown an isomeric, end and top view, respectively, of a third embodiment of the present invention. In this embodiment, the mounting structure, generally indicated at 50, is also formed from an L-shaped sheet of material having high thermal and electrical conductivity characteristics. One leg of the L-shaped sheet is rolled about an axis with a slight overlap 52 to form a coiled or loop portion 54 for flexibly gripping an electronic component, such as, the envelope of an electron tube, and the other leg of the L-shaped sheet is bent 180° about an axis to form an inwardly projecting U-shaped flange portion 56 for frictionally gripping the peripheral surfaces of the mounting board 58. A connecting portion 60 is provided for connecting the coil portion 54 and the flange portion 56. In this embodiment the connecting portion 60 is bent 90° along line 62 so that the electronic component (not shown) will be held by the mounting structure in a position in which its axis will be perpendicular to the mounting board 58 and parallel to the plane of the edge of the flange portion 56. It should also be noted, that the edge 64 of coiled portion 54 is twisted counterclockwise about a point 66 for establishing a more absolute gripping of the electronic component inserted within the coiled portion 54. The practical operation of this third embodiment is substantially the same as that described in detail with regard to FIGURES 1–3.

Figure 10:
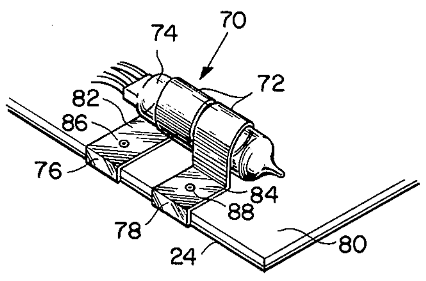
FIGURE 10 is an isometric view of a fourth embodiment of the present invention also showing the physical arrangement of elements.

Referring now in detail to FIGURE 10, there is shown an isometric view of a fourth embodiment of the present invention. In this embodiment, the mounting structure, generally indicated at 70, is formed from an elongated strip of material having high thermal and electrical conductivity characteristics. The elongated strip of material is rolled about an axis to form a coiled portion 72 having at least two continuous loops for flexibly gripping the envelope of an electronic component such as, the electron tube 74, and has both its ends bent 180° about an axis to form inwardly projecting U-shaped flange portions 76 and 78 for frictionally gripping the peripheral surfaces of the mounting board 80. Flat connecting portions 82 and 84 respectively connect flange portions 76 and 78 to coiled portion 72 and respectively include projecting nipples 86 and 88. Nipples 86 and 88 cooperatively engage corresponding detents formed in the board 80 for precisely locating the mounting structure 70 in a predetermined position on the board 80.

Figure 11:
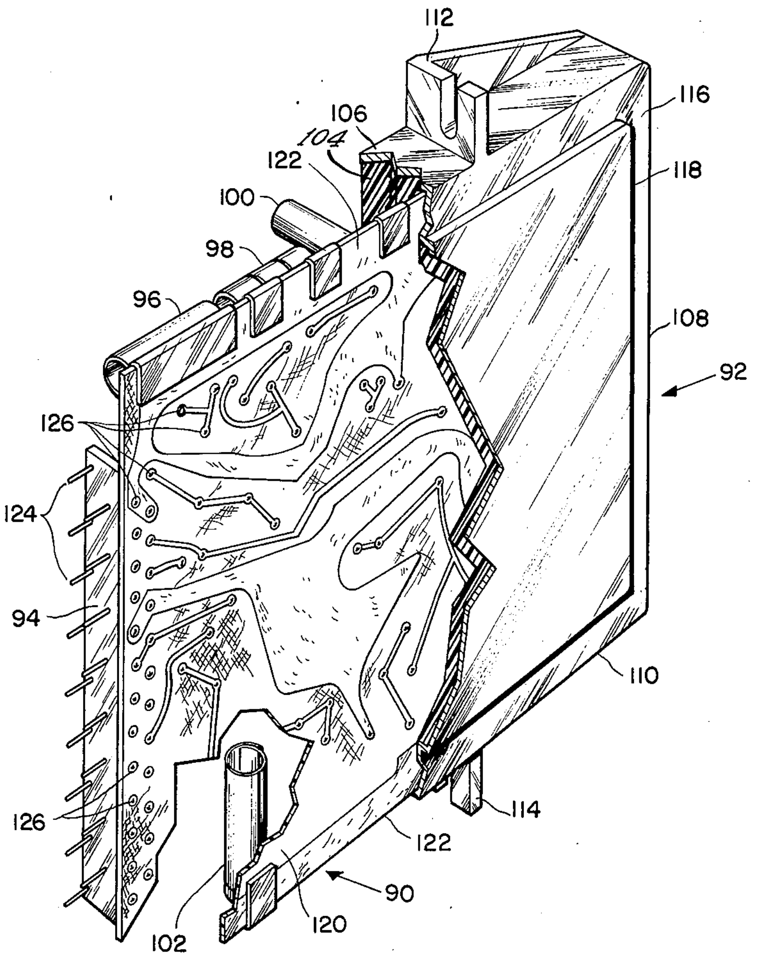
FIGURE 11 is an isometric view of an encapsulated electronic module showing the four embodiments of the instant mounting structure connected to the mounting board with part of the module shown in section.

Referring now in detail to FIGURE 11, there is shown an isometric view of an encapsulated electronic module showing the four embodiments of the mounting structure of the present invention, as depicted in FIGURES 1–3, 4–6, 7–9, and 10, respectively, connected to a mounting board with part of the module shown in section. The encapsulated module basically comprises a mounting board 90 connected to a bracket 92, a strip plug connector 94 mounted on the mounting board 90, mounting structures 96, 98, 100 and 102 frictionally mounted to the peripheral surfaces of the board 90, and cured encapsulating agent 104 which completely encases the mounting board 90 and mounting structures 96, 98, 100 and 102 within the confines of the bracket 92. The bracket 92 is a rectangular shaped end and top opened dish having three side walls 106, 108 and 110, U-shaped connecting wings 112 and 114, a bottom wall 116, and a rectangular central well 118. The mounting board 90 is also rectangular shaped and has a partially metal coated lower face 120. The metal coatings on the lower face 120 constitute a conventional printed circuit with the periphery 122 of the face 120 constituting the ground terminal of the printed circuit. The mounting structures 96, 98, 100 and 102 are substantially the same as the mounting structures 10, 70, 50 and 30, respectively, of FIGURES 1, 10, 7 and 4, respectively. It should be noted that the U-shaped flanges of mounting structures 96, 98, 100 and 102 have their inner surfaces engaging the metal coated periphery of the mounting board 90 and their outer surfaces engaging the inner surface of the bottom wall 116 of bracket 92. Also, it should be noted that none of the cured encapsulating agent 104 exists between the metal coated periphery 122 of the mounting board 90 and the periphery of the bottom wall 116 of bracket 92. Accordingly, there exists a thermal and electrical conductivity path between the loops of mounting structures 96, 98, 100 and 102 and the bracket 92. Therefore, the heat generated by any electronic components flexibly held by the mounting structures will be thermally conducted away from the loops of the mounting structures 96, 98, 100 and 102 to the bracket 92. Then bracket 92 accordingly functions as a heat sink to effectively aid in the dissipation of heat generated by the electronic components. It should also be noted that the pins 124 of strip plug connector 94 are not covered by the cured encapsulating agent 104 but extend outward and away from the open end of the bracket 92 for cooperative engagement with a corresponding female strip plug connector (not shown).

A brief description regarding the method of manufacturing the encapsulated module depicted in FIGURE 11 follows:

Specific types of mounting structures in accordance with the present invention are selected for holding electronic components to the printed circuit board 90. These mounting structures are predeterminedly positioned upon the printed circuit board 90. The involved electronic components are then positioned on the circuit board 90 some of which are flexibly held in position by the several mounting structures. The lead wires of the electronic components and other connecting wires are then properly inserted into pre-drilled openings 126 of the printed circuit board 90. The partially coated surface of the printed circuit board 90 is then flow soldered by conventional methods and connected to the bracket 92 by any well known connecting means (not shown), such as screws, bolts, welding, etc. An encapsulating fixture (not shown) is connected to the bracket 92 which accordingly provides a partially enclosed space defined by the fixture and side walls 106, 108 and 110 of bracket 92. An encapsulating agent is then inserted into the space defined by the fixture and side walls and into the space defined by printed circuit board 90 and central well 118. This encapsulating agent is then cured thereby encasing completely the electronic components located in the space defined by the fixture and side walls and the area of the printed circuit board 90 which overlies the central well 118. The encapsulating fixture is then removed thereby leaving an encapsulated module as depicted in FIGURE 11. It should again be noted that neither the pins 124 nor the periphery of the printed circuit board 90 and lower wall 116 of bracket 92 are encased with the cured encapsulating agent.

In each of the above described embodiments of the present invention, it is preferable to construct the coiled or loop portions of the mounting structure with a diameter slightly smaller than the diameter of the electronic component to be inserted therein so that the coiled or loop portions will firmly and flexibly grip the envelope of the electronic component. Also, the width of the flange portion of the mounting structures should be slightly smaller than the height of the mounting board so that there will exist sufficient friction forces between the inner faces of the flange portions and the peripheral faces of the mounting board.

It is to be also understood, of course, that although the support means depicted in the several figures is a conventional printed circuit board having parallel faces and two pairs of parallel edges with one face being at least partially coated with a conductive material and the other face being uncoated, other well known support means may be substituted without departing from the spirit of the present invention and the scope of the claims.

Although the above described first, second and third embodiments of the present invention do not include projecting nipples for cooperative engagement with corresponding detents, it is to be understood that this feature may be incorporated into these embodiments if so desired. The use of a projecting nipple and corresponding detent is advantageous whenever precision location of the mounting structure upon the mounting board is required.

It should be noted at this point that each of the central portions, i.e., 22 of FIGS. 1–3; 40 of FIGS. 4–6, 60 FIGS. 7–9 and 82–84 of FIG. 10, which connect the coiled portions 10, 30, 50 and 70 to the flanges 18, 36, 56 and 76–78, respectively, advantageously permit such coiled portions to be located at predetermined positions upon the upper surfaces of the mounting boards relative to the edges of the mounting boards to which such flanges are connected. Thus, by shortening or extending the length of the sheet material used in fabricating the embodiment of FIGS. 1–3, or by shortening or extending the length of one leg of the L-shaped sheet of material used in fabricating the embodiment of FIGS. 4–6 and 7–9, or by shortening or extending the length of the elongated strip of material used in fabricating the embodiment of FIG. 10, the distance between coiled portions 10, 30, 50 and 70 and flanges 18, 36, 56 and 76–78, respectively, may be predeterminedly modified, thereby locating such coiled portions at desired positions upon the upper surface of the mounting boards.

It will be apparent from the foregoing that the present invention uniquely provides a mounting structure for electronic components having the quadruplicate function of effective and improved (1) mounting, (2) thermal dissipation, (3) electrostatic and electromagnetic shielding and (4) electrical grounding. The use of a single sheet or strip of material having high thermal and electrical conductivity characteristics provides a mounting structure which is simple in construction, economical to manufacture and highly reliable in performing the functions intended and achieving the desired objects. Further, the formation of a mounting structure from a flat sheet of material having a simple coiled portion and an inwardly extending U-shaped flange portion integrally connected to the coiled portion provides effective means for resiliently gripping the envelope of an electronic component and for frictionally gripping the peripheral surfaces of a mounting board. Accordingly, this resilient but firm contact of the coiled portion with the tube envelope and this firm frictional contact of the flange portion with the copper coated surface of the mounting board provide not only an effective heat conduction path and electrical ground but also effective shielding from high frequency energy, noise and extraneous radiation. In addition, the present invention permits mounting of the electronic component with its axis either parallel or perpendicular to the mountnig board yet still retain the foregoing advantages.

It will be further apparent that many modifications and variations of the present invention are possible in view of the foregoing teachings. It is therefore to be understood that within the scope of the appended claims the invention may be practiced otherwise than as specifically described.

We claim:

1. A combined mounting, thermal dissipating and shielding structure (1) securing an electronic component to a support, (2) dissipating heat generated by said electronic component, (3) shielding said electronic component from high frequency energy, noise and extraneous radiation, and (4) grounding said structure to said support, said structure being formed from a piece of substantially flat resilient material having high thermal and electrical conductivity characteristics and comprising, in combination:

(1) a coiled portion resiliently gripping the envelope of said electronic component, (2) a U-shaped flange portion projecting towards said coiled portion frictionally gripping the peripheral surfaces of said support, and (3) a connecting portion integrally conecting said flange portion to said coiled portion holding said coiled portion in relative position with respect to said flange portion with said electronic component held adjacent to the surface of said support at any predetermined position thereon.

2. A mounting structure in accordance with claim 1 wherein said coiled portion is a single loop of resilient material having a slight overlap.

3. A mounting structure in accordance with claim 1 wherein said axis of said coiled portion is parallel to the surface of said support.

4. A mounting structure in accordance with claim 1 wherein said axis of said coiled portion is perpendicular to the surface of said support.

5. An apparatus (1) securing an electron discharge tube to a printed circuit board, (2) dissipating heat generated by said tube, (3) shielding said tube from high frequency energy, noise and extraneous radiations, and (4) grounding said apparatus to said board, said board having parallel faces and two pairs of parallel edges and being made of non-conductive material with one of said faces being at least partially coated with a conductive material and the other of said faces being uncoated, said apparatus being formed from a rectangular sheet of substantially flexible material having high thermal and electrical conductivity characteristics and having parallel faces and two pairs of parallel edges, one edge of one pair of edges of said sheet of material being rolled about an axis to form a single loop having a predetermined diameter and a slight overlap, said diameter of said loop being slightly smaller than the diameter of said tube firmly gripped within said loop, the other edge of said pair of edges of said sheet being bent substantially 180° about an axis forming a U-shaped flange with said other edge of said sheet extending toward said axis of said loop, said flange frictionally gripping the periphery of said faces of said board and abutting one edge of one of said pair of edges of said board, providing a thermal and electrical conduction path from said loop to said coated surface of said board, said axis of said U-shaped flange being parallel to said axis of said loop and the axis of said tube gripped by said loop being parallel to said axis of said U-shaped flange, and the remaining portion of said sheet of material being substantially parallel to and abutting said uncoated face of said board so that said tube will be flexibly held adjacent said uncoated face of said board.

6. An apparatus (1) securing an electron discharge tube to a printed circuit board, (2) dissipating heat generated by said tube, (3) shielding said tube from high frequency energy, noise and extraneous radiations, and (4) grounding said apparatus to said board, said board having parallel faces and two pairs of parallel edges and being made of non-conductive material with one of said faces being at least partially coated with a conductive material and the other of said faces being uncoated, said apparatus being formed from an L-shaped sheet of substantially flexible material having high thermal and electrical conductivity characteristics and having two legs substantially perpendicular to each other, one leg of said sheet of material being rolled about an axis forming a single loop having a predetermined diameter and a slight overlap, said diameter of said loop being slightly smaller than the diameter of said tube firmly gripped within said loop, the end of the other leg of said sheet of material being bent substantially 180° about an axis forming a U-shaped flange with said end of said other leg extending toward said axis of said loop, said flange frictionally gripping the periphery of said faces of said board and abutting one edge of one of said pair of edges of said board, providing a thermal and electrical conduction path from said loop to said coated face of said board, said axis of said U-shaped flange being perpendicular to said axis of said loop, the axis of said tube gripped by said loop being perpendicular to said axis of said flange, and the remaining portion of said sheet of material being substantially parallel to and abutting said uncoated face of said board.

7. An apparatus (1) securing an electron discharge tube to a printed circuit board (2) dissipating heat generated by said tube, (3) shielding said tube from high frequency energy, noise, and extraneous radiations, and (4) grounding said apparatus to said board, said board having parallel faces and two pairs of parallel edges and being made of non-conductive material with one of said faces being at least partially coated with a conductive material and the other of said faces being uncoated, said apparatus being formed from an L-shaped sheet of substantially flexible material having high thermal and electrical conductivity characteristics and having two legs substantially perpendicular to each other, one leg of said sheet of material being rolled about an axis forming a single loop having a predetermined diameter and a slight overlap, said diameter of said loop being slightly smaller than the diameter of said tube firmly gripped within said loop, the end of the other leg of said sheet of material being bent substantially 180° about an axis forming a U-shaped flange with said end of said other leg extending toward said axis of said loop, said flange frictionally gripping the periphery of said faces of said board and abutting one edge of said pair of edges of said board, providing a thermal and electrical conduction path from said loop to said coated face of said board, said other leg being bent substantially 90° at a point close to the apex of said L-shaped sheet of material with said axis of said loop being perpendicular to said faces of said board, said axis of said U-shaped flange being transverse to said axis of said loop, the axis of said tube being transverse to the axis of said flange, and the remaining portion of said other leg of said sheet of material being substantially parallel to and abutting said uncoated face of said board.

8. An apparatus (1) securing an electron discharge tube to a printed circuit board, (2) dissipating heat generated by said tube, (3) shielding said tube from high frequency energy, noise and extraneous radiations, and (4) grounding said apparatus to said board, said board having parallel faces and two pairs of parallel edges and being made of non-conductive material with one of said faces being at least partially coated with a conductive material and the other of said faces being uncoated, said apparatus being formed from an elongated sheet of substantially flexible material having high thermal and electrical conductivity characteristics and having parallel faces, sides and edges, said sheet of material being rolled about an axis forming at least two continuous loops, having a predetermined diameter and which do not overlap, said diameters of said loops being slightly smaller than the diameter of said tube firmly gripped within said loops, each of said edges of said sheet being bent substantially 180° about an axis forming two U-shaped flanges with said edges of said sheet extending toward said axis of said loops, said flanges frictionally gripping the periphery of said faces of said board and abutting one edge of one of said pair of edges of said board providing thermal and electrical conduction path from said loops to said coated surface of said board, said axis of said U-shaped flanges being parallel to said axis of said loops, the axis of said tube gripped by said loops being parallel to said axis of said flanges, and the remaining portion of said sheet of material having projecting nipple means cooperatively engaging corresponding detent means formed in said board precisely positioning said apparatus on said board and being substantially parallel to and abutting said uncoated face of said board, said tube being flexibly held adjacent said uncoated face of said board.

9. A mounting structure securing electronic components to a substantially flat mounting board comprising, in combination:

(a) coiled means having spring like characteristics resiliently gripping the envelope of said electronic components, said coiled means including at least two continuous loops of resilient material which do not overlap;

(b) flange means having spring-like characteristics frictionally gripping said mounting board, said flange means including two U-shaped flanges projecting toward the axis of said coiled means; and (c) connecting means respectively connecting said U-shaped flanges to the end of said coiled means holding said coiled means in relative position with respect to said U-shaped flanges with said electronic components being held adjacent to the surface of said mounting board, said connecting means including projecting nipple means cooperatively engaging corresponding detent means formed in said mounting board for precisely positioning said mounting structure on said mounting board.

10. A combined mounting, thermal dissipating and shielding structure (1) securing an electronic component to a support, (2) dissipating heat generated by said electronic component, (3) shielding said elecoronic component from high frequency energy, noise and extraneous radiation, and (4) grounding said structure to said support, said structure being formed from a piece of substantially flat resilient material having high thermal and electrical conductivity characteristics and comprising, in combination:

(a) a coiled portion resiliently gripping said electronic components, said coiled portion including at least two continuous loops of resilient material which do not overlap;

(b) two U-shaped flange portions projecting toward the axis of said coiled portions frictionally gripping the peripheral surfaces of said support, and (c) two connecting portions respectively connecting said U-shaped flanges to the ends of said coiled portion holding said coiled portion in relative position with respect to said U-shaped flanges, said electronic component being held adjacent to the surface of said support at any predetermined position thereon.

References Cited by the Examiner

UNITED STATES PATENTS

| | | | |
|---|---|---|---|
| 2,933,292 | 4/60 | Chislow | 174—35 X |
| 3,006,982 | 10/61 | Krantz | 174—68.5 |
| 3,042,740 | 7/62 | Bosworth | 174—68.5 |

JOHN F. BURNS, *Primary Examiner.*

JOHN P. WILDMAN, *Examiner.*